United States Patent [19]

Cedrone et al.

[11] Patent Number: 4,534,605
[45] Date of Patent: Aug. 13, 1985

[54] SYMMETRICAL, SINGLE POINT DRIVE FOR CONTACTS OF AN INTEGRATED CIRCUIT TESTER

[75] Inventors: Nicholas J. Cedrone, Wellesley Hills; Kenneth R. Lee, Lincoln, both of Mass.

[73] Assignee: Daymarc Corporation, Waltham, Mass.

[21] Appl. No.: 497,206

[22] Filed: May 23, 1983

[51] Int. Cl.³ .......................................... H01R 13/629
[52] U.S. Cl. .................................. 339/75 M; 339/75 R
[58] Field of Search .......................... 339/74 R, 75 M; 324/158 F; 269/161, 163, 218, 238

[56] References Cited

U.S. PATENT DOCUMENTS

| | | | |
|---|---|---|---|
| 2,183,680 | 12/1939 | Kahliff | 269/238 |
| 3,113,508 | 12/1963 | Trachtman | 269/218 |
| 3,170,322 | 2/1965 | Cavanaugh | 269/161 |
| 3,412,333 | 11/1968 | Frick et al. | 324/158 F |
| 3,715,662 | 2/1973 | Richelmann | 324/158 F |
| 3,763,459 | 10/1973 | Millis | 339/75 M |
| 3,891,898 | 6/1975 | Damon | 317/101 CC |
| 4,047,780 | 9/1977 | Cedrone | 339/17 CF |
| 4,068,170 | 1/1978 | Chayka et al. | 339/74 R |
| 4,367,584 | 1/1983 | Janisiewicz et al. | 324/158 F |
| 4,419,626 | 12/1983 | Cedrone et al. | 324/158 F |

FOREIGN PATENT DOCUMENTS 686380 3/1965 Italy .

OTHER PUBLICATIONS

Ross, "Test Sockett", IBM Technical Disclosure Bulletin, vol. 10, No. 5, Oct. 1967, p. 549.

*Primary Examiner*—John McQuade
*Attorney, Agent, or Firm*—Kenway & Jenney

[57] ABSTRACT

A drive system flexes the free ends of two parallel sets of contacts into electrical connection with two parallel rows of leads on an integrated circuit. The drive system uses a pair of opposed, identical actuator arms. A common, movable pivot axis, preferably one defined by a link pin pivotally connected to both arms, connects one end of the arms. A solenoid drive is connected to the link pin. Activation of the solenoid draws the link pin towards it which rotates each arm about a fixed pivot point to generate a symmetrical, pincer-like movement of the free ends of the arms. Push bars secured to these free ends drive the contacts into a flexed position. The symmetrical motion of the push bars minimizes lateral movement of the integrated circuit and develops a generally uniform contact force at all of the leads. A cable with an adjustable length preferably couples the drive element with the link pin.

9 Claims, 3 Drawing Figures

SYMMETRICAL, SINGLE POINT DRIVE FOR CONTACTS OF AN INTEGRATED CIRCUIT TESTER

BACKGROUND OF THE INVENTION

This invention relates in general to handling, testing and sorting apparatus for electronic devices. More specifically, it relates to apparatus that repeatedly drives two parallel sets of contacts into electrical connection with corresponding leads on an integrated circuit in a symmetrical manner.

In the manufacture of integrated circuits (IC's) and the like, it is important to test each IC reliably and at a high throughput rate. Typically modern IC handler/testers operate at rates in excess of 5,000 IC'per hour with each IC being held at a test site for testing that is completed in a time interval of typically 100 milliseconds. Once an IC comes to rest at the test site, its leads are connected to test circuitry by a set of contacts. IC's generally have a rectilinear, box-like body with two parallel rows of leads originating from the sides of the body, curving rapidly at a shoulder, and then extending in a direction generally normal to one face of the body. The contacts are arrayed in two parallel rows with the IC positioned between the contacts so that one contact or a pair of contacts can make an electrical connection with a corresponding lead on the IC.

Although the contacts can be mounted on a movable member that carries them into and out of electrical connection, as described in commonly assigned U.S. Pat. No. 4,047,780, they are more commonly mounted with one end fixed. The free end makes the electrical connection. The contacts are normally spaced from the leads, but the spacing is close enough that they can be flexed into connection by a driving member. The most common driving arrangement is to use two separate drive elements, such as solenoids, that each propel a rigid member against one of the rows of contacts causing it to flex.

In order to have a reliable test, each contact should make a good electrical connection with its associated lead. Because some leads may be out of alignment, it is therefore important that the contacts flex far enough to make a reliable connection with every lead. Flexure distance can also be important where the size of the IC's being tested vary or the angular orientation and therefore the position of the leads with respect to the IC's body vary. Reliability is also a function of the uniformity and magnitude of the contact force. Clearly an increased stroke of a drive element will flex the contacts more and produce an increased contact force. A countervailing consideration is that repeated large flexures of the contacts results in metal fatigue that can deteriorate the resilience of the contact to a level where it adversely affects the reliability of the test.

The contact system must also operate on IC's of different sizes. Usually a wide variation in the width being tested will require a change in the contact assembly. The drive assembly for the contacts, however, is a normally fixed component of the testing apparatus. The drive assembly remains in position and must be adjustable.

It is also significant that the IC's are normally loosely-guided to facilitate their movement through the tester and to accommodate variations in size. This is true at the test site also. However, if one set of contacts is driven into connection with one row of leads before the other set reaches its leads, then the drive system will push the entire IC to one side. This is undesirable because it varies the contact force on the leads and results in a less reliable test. It also can accentuate the metal fatigue problem discussed above because one set of contacts flexes through a greater distance to establish the desired contact force. Ideally then, all the contacts should make physical contact with the leads at substantially the same time. The aforementioned U.S. Pat. No. 4,047,780 describes a scotch yoke drive that produces a symmetrical clamping movement of two sets of contacts. An important consideration in the '780 patent is to develop this motion in a narrow space (measured in the direction of the leads) to minimize the separations between the device being tested and the test circuitry. While the '780 contact drive works well, it is a comparatively complex structure with attendant cost disadvantages. Also, its geometry places limitations on its usefulness.

It is therefore a principal object of this invention to provide a simple contact drive system that produces a symmetrical drive force on two parallel rows of contacts that develop a uniform contact force and minimizes movement of the IC as it is connected to the contacts.

Another object is to provide a contact drive system with the foregoing advantages that is readily adjusted to accommodate different IC's or to vary the operation of the contact system.

A further object is to provide a contact drive system with the foregoing advantages that has a comparatively low cost of manufacture and is rugged and reliable in operation.

Another object is to provide a contact drive system with the foregoing advantages that is spatially compact, particularly in the lateral direction, to allow a high density, parallel processing of IC's.

SUMMARY OF THE INVENTION

A drive system for a set of "fixed end" contacts arrayed in two parallel rows includes a pair of opposed actuator arms, each mounted to pivot about its own fixed axis of rotation. A free end of each arm mounts a push bar that engages and flexes one row of contacts into electrical connection with a corresponding row of leads on an IC. This flexure movement corresponds to a movement of the actuator arm from a retracted position, where the contacts are spaced from the leads, to a flexed position where the free end of the contacts make a reliable electrical connection with the leads. On the opposite side of the fixed pivots from the push bars, the actuator arms are linked at a common, movable pivot axis. Preferably this axis is defined by a vertical link pin that is pivotally mounted to both actuator arms. A drive element such as a solenoid draws the link pin along an axis transverse to the direction of the movement of the push bars. This assembly converts a linear reciprocating movement of the solenoid into a symmetrical, pincer-like movement of the push bars.

Spring elements urge the arms toward the retracted position. The mutual spacing of the push bars and the degree of flexural movement they produce in the contacts is adjusted by changing the length of a coupling between the solenoid and the link bar to change the travel distance of the link bar during a stroke of the solenoid. The coupling is preferably a flexible cable that is replaceably secured in the link bar. Alternately, an adjustment can be made by shifting the position of the solenoid and the coupling without changing the length of the coupling.

These and other features and objects of the present invention will be more fully understood from the following detailed description which should be read in light of the accompanying drawings.

DESCRIPTION OF THE PREFERRED EMBODIMENTS

Figure 1:
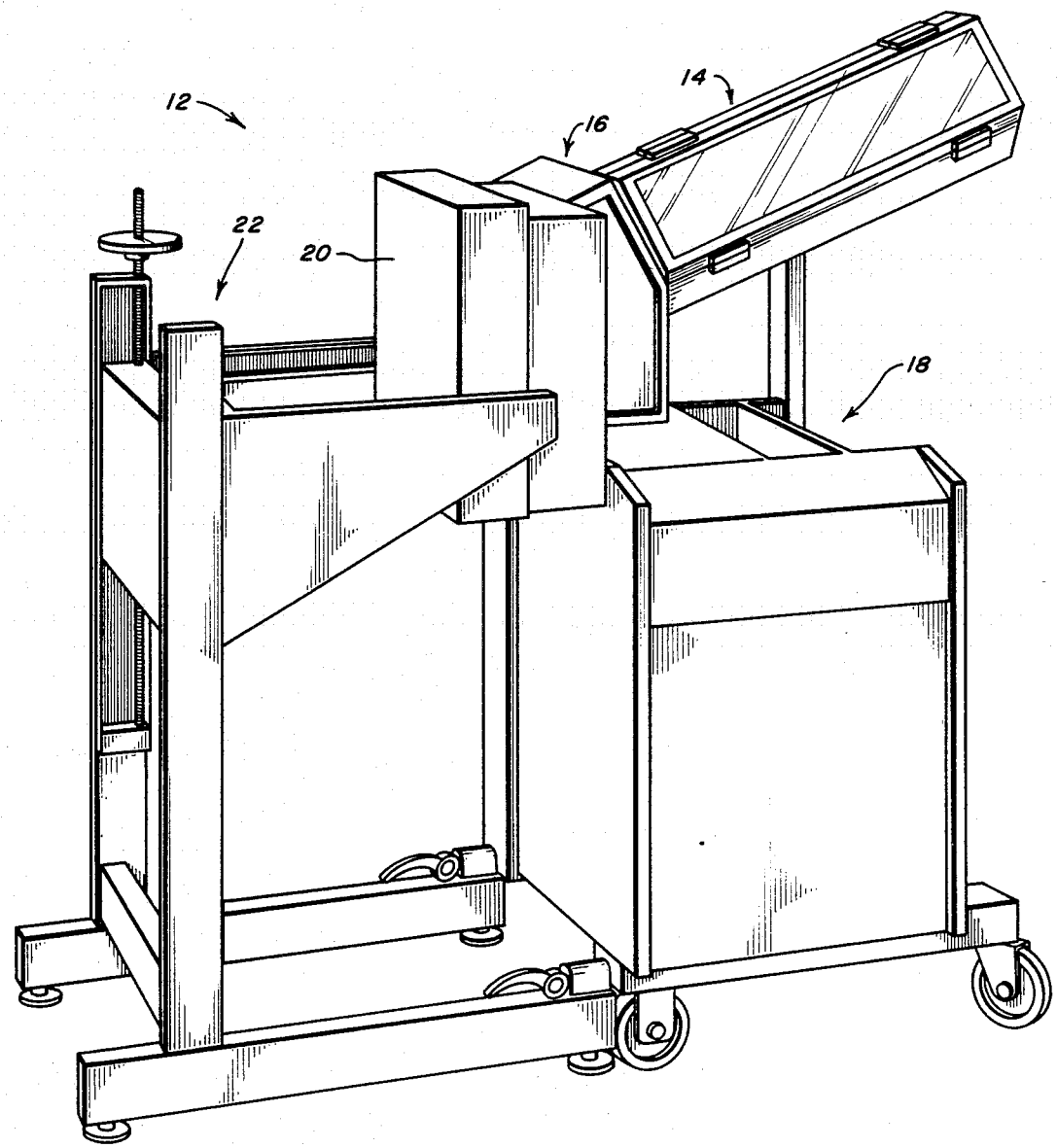
FIG. 1 is a simplified view in perspective of a machine for testing IC's that utilizes a contact drive system according to the present invention to flex two parallel rows of contacts into electrical connection with an IC.
Figure 2:
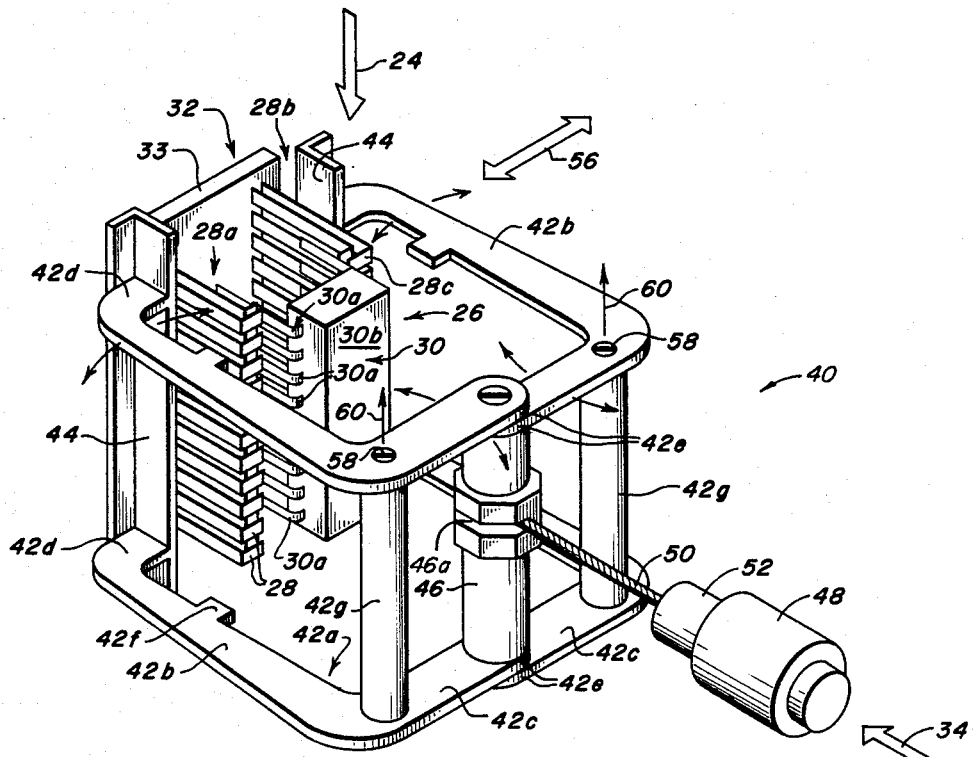
FIG. 2 is a view in perspective of the contact drive system according to the present invention.
Figure 3:
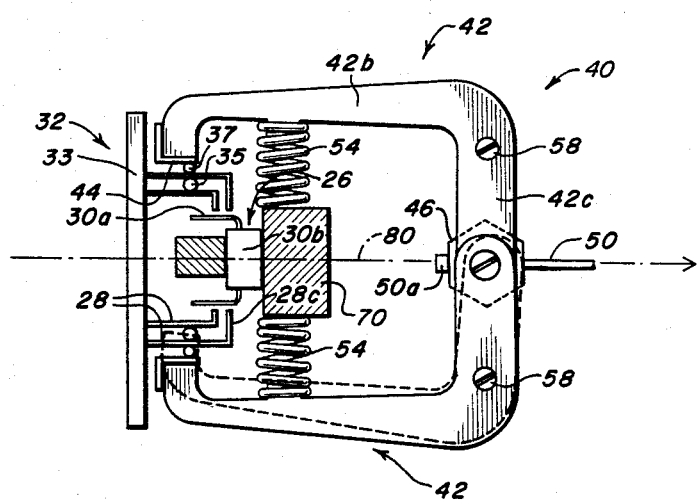
FIG. 3 is a simplified view in top elevation of the drive system shown in FIG. 2 with the driving element omitted.

FIG. 1 shows an integrated circuit (IC) test handling and sorting apparatus 12 that includes a storage unit 14, a test assembly 16, a sorter 18 and test circuitry 20 mounted on a frame 22 and positioned immediately adjacent a test site for the IC's in the test assembly 16. A steady succession of IC's is fed from the storage unit 14 to the test assembly 16. The IC's each have a generally rectilinear, box-like body. The IC's also include two parallel rows of leads that extend generally in the direction of a normal to one face of the IC body (as shown in FIGS. 2 and 3). The IC's move in an end-to-end line. In the test assembly 16, the IC's enter at an acute angle with respect to the horizontal (determined by the angular orientation of the storage unit 14 itself, as shown), but are reoriented in a conventional manner for a vertical, free-fall movement through the test assembly to the sorter 18 along a path 24. The test assembly includes a test site 26 where the IC's, one-by-one, momentarily come to rest and undergo a rapid electronic testing under the control of the circuitry 20. Depending upon the results of the test, the tested IC when released from the test site, is directed by the sorter 18 to one of several collecting bins or tubes (not shown).

A set of contacts 28 is located adjacent the test site to connect an IC 30 located at the test site to the test circuit 20. The contacts 28 are shown as part of a contactor assembly 32 that includes an insulating base 33 that holds one end of each contact. The contacts are thin strips of a resilient, conductive material of conventional design. They are shown arrayed in two parallel rows 28a and 28b of Kelvin contacts (each connection to a lead 30a is made by two overlying contact members) positioned "outside" of the IC 30. Insulating spacer rods 35, 35 are interposed between the Kelvin pairs to maintain their separation and to transmit a flexing force to the "inner" contact of the pair. Insulating rods 37, 37 are positioned in alignment with the rods 35 but on the "outer" surface of the "outer" contact of each pair. The rods 37, 37 ensure that the driving force applied to the contacts is at a fixed distance from the base 33. The assembly 32 is also positioned along a horizontal "front-to-rear" direction 34 so that "angled" free ends 28c of each contact can move along a horizontal direction 56 to make an electrical connection with the leads at their "shoulders" (a point on a lead after it curves as it leaves the boy 30b, but close enough to the body so that variations in the orientation of the leads are not a problem.)

A contact drive assembly 40 according to the present invention includes a pair of actuator arms 42,42, a pair of push bars 44,44 mounted at a free end of each actuator arm, a link pin 46, a solenoid 48, a cable 50 connecting the solenoid 48 to the link pin 46, and an adjustment mechanism 52 threaded on the solenoid whose rotation changes the length of the cable 50. Alternately, the mechanism 52 can shift the position of the solenoid 48 with the length of the cable remaining constant. In either case, the mechanism adjusts the initial "rest" position of the link pin 46 along the direction 34. Springs 54,54 urge the arms 42,42 away from one another to a retracted position (solid line positions in FIGS. 2 and 3) where the push bars 44,44 are both spaced from the associated rows 28a,28b of contacts (or at least the free ends of the contacts are spaced from the leads of the IC 30). As will be described in more detail below, activation of the solenoid draws the link pin toward the solenoid along the direction 34 which produces a symmetrical, pincer-like movement of the push bars 44,44 along the direction 56 toward the contacts 28. The directions 24, 34 and 56 are mutually orthogonal.

Each arm 42 is mounted on a shaft 58 within a tubular spacer member 42g for rotating movement about a fixed axis of rotation 60. Each arm also has a three-dimensional, frame-like construction to provide an enhanced structural rigidity which helps to ensure that the movements of the arms can be accurately and reliably controlled. To this end, the arms 42 each include a pair of identical members 42a, 42a spaced along the vertical direction 24. Each member 42a has a portion 42b that extends generally in the horizontal direction 34 from the associated fixed pivot 58 to the associated push bar 44 and a portion 42c that extends from the pivot 58 to the link pin 46. In the preferred form, the portions 42b and 42c together form a generally L-shaped member 42a. A "front" or free end 42d of each member 42a is preferably angled toward the IC, as shown, to mount one of the push bars. Ends 42e of the portions 42c overlap one another and are pivotally mounted to the link pin. The arm portions 42b each have an "inwardly" facing projection 42f that holds an end of one of the springs 54. The other end of each spring is secured to a fixed guide member 70 located adjacent the "rear" face of the IC 30.

The link pin 46 has an interior, lateral slot 46a that receives one end of the cable 50. The cable slides laterally into the slot. A stop member 50a carried on the cable is positioned on the side of the link pin opposite the solenoid 48. The member 50a is sufficiently large that it cannot pass through the slot. This arrangement provides a rapid coupling or uncoupling of the solenoid and the link pin.

With this drive system, a reciprocating linear motion of the solenoid (opposed by the springs 54) acting on a single point, the link pin 46, is developed into a corresponding symmetrical movement of the push bars 44,44 generally along the direction 56. The geometry of the actuating arms determines the precise nature of the correspondence. As shown, the arm portions 42b are longer than the arm portions 42c which results in an amplification of the motion of the solenoid. The system develops this symmetrical motion because (1) the drive system has identical operating halves along a vertical centerline 80 (FIG. 3), (2) there is a common drive element 48 and a single point drive, and (3) the structure and operating characteristics of the actuating arms as described above. This symmetrical movement flexes the free ends of the contacts into electrical connection with the leads (phantom position shown in FIG. 3) while minimizing the likelihood and degree of a lateral displacement of the IC 30 as a whole. It also develops a uniform contact pressure on all of the leads 30a.

It is also significant that the drive system 40 is compact, particularly in the lateral direction 56. As a result, multiple IC processing paths can be established in a closely spaced relationship. This provides the possibility of parallel processing with an attendant increase in the testing rate of the apparatus 12.

While this invention has been described with respect to its preferred embodiments, it will be understood that various modifications will occur to those skilled in the art from the foregoing detailed description of the preferred embodiments and the accompanying drawings. Such modifications are intended to fall within the scope of the appended claims.

What is claimed is:

1. A drive system for flexing the free ends of two parallel, spaced apart rows of contacts in a contact assembly into electrical connection with two generally parallel rows of leads of an integrated circuit that is positioned at a test site between the rows of contacts, said flexing occurring generally along a first lateral direction and said leads each extending generally in a second direction perpendicular to the first direction, comprising, drive means that produces a linear movement generally along said second direction, generally along an axis of symmetry for said drive system, and away from said integrated circuit, a pair of push bars that each extend in a third direction perpendicular to said first and second directions and adapted to be positioned on opposite sides of and adjacent to said two parallel rows of contacts, and a pair of actuator arms each mounted for a rotating movement about a fixed axis and extending generally in said second direction, each of said fixed axes being laterally offset from said axis of symmetry generally in said first direction, each of said arms having a free end that mounts one of said push bars and a driven end, said free and driven ends lying on opposite sides of said fixed axis of rotation, and means for operatively coupling said drive means simultaneously to both of said actuator arms at their driven ends so that said linear movement of said drive means is converted into a symmetrical reciprocating movement of said push bars, generally along said first direction, between a retracted position where said contacts are spaced from said leads and a flexed position where said contacts are each in electrical connection with an associated one of said leads, wherein said coupling means comprises an unguided, flexible cord.

2. The drive system according to claim 1 wherein said actuator arms each have a first portion that extends from said fixed axis of rotation to said free end and a second portion that extends from said fixed axis of rotation to said driven end.

3. The drive system according to claim 2 wherein said coupling means includes a link pin that is pivotally connected to said actuator arms at a single pivot axis, said link pin being movable in said second direction in response to a movement of said drive means.

4. The drive system according to claim 3 wherein said coupling means further includes linkage means secured at one end to said drive means and secured at the other end to said link pin.

5. The drive system according to claims 1 or 4 further comprising means for urging said actuator arms toward said retracted position, said urging means acting in opposition to said drive means.

6. The drive means according to claim 4 wherein said linkage means is replaceably secured to said link pin.

7. The drive system according to claim 4 further comprising means for adjusting the initial rest position of said link pin, wherein said push bars are in the retracted position along said second direction.

8. The drive system according to claim 7 wherein said adjusting means comprises means for changing the length of said linkage means.

9. The drive system according to claim 7 wherein said adjusting means comprises means for changing the position of said drive means.

* * * * *